United States Patent [19]

Narancic

[11] 3,959,722
[45] May 25, 1976

[54] INTEGRATED CIRCUIT FOR CONTROL OF THE TRANSIENT RECOVERY VOLTAGE IN DIRECT AND SYNTHETIC TESTING OF HIGH VOLTAGE CIRCUIT BREAKERS

[75] Inventor: Vojislav Narancic, Montreal, Canada

[73] Assignee: Institut de Recherches de l'Hydro-Quebec (IREQ), Varenne, Canada

[22] Filed: Nov. 18, 1974

[21] Appl. No.: 524,661

[52] U.S. Cl............................ 324/28 CB; 324/28 R
[51] Int. Cl.²...................................... G01R 31/02
[58] Field of Search......... 324/28 R, 28 CB, 28 CH, 324/28 CR, 28 RS, 28 SE

[56] References Cited
UNITED STATES PATENTS

| 2,888,639 | 5/1959 | Petermichl | 324/28 R |
| 3,064,183 | 11/1962 | Slamecka | 324/28 R |
| 3,373,350 | 3/1968 | Reece | 324/28 R |
| 3,496,300 | 2/1970 | Stokes | 324/28 R |
| 3,515,982 | 6/1970 | Longworth et al. | 324/28 R |

*Primary Examiner*—R. V. Rolinec
*Assistant Examiner*—Michael J. Tokar

[57] ABSTRACT

A test circuit for testing high voltage circuit breakers, the circuit being capable of providing a transient recovery voltage of a predetermined form to test the breaking capacity of circuit breakers. The test circuit comprises a first multi-parameter network for producing low frequency components of the transient recovery voltage, which network is constituted of a first inductance connected in series between a H.V. source and a circuit breaker, and of a capacitance-resistance unit connected to the output of the first inductance. A second multi-parameter network is provided for producing high frequency components of the transient recovery voltage. This second network is connected in series with the unit. The second network and the unit are connected across the terminals of the circuit breaker undergoing test.

8 Claims, 5 Drawing Figures

INTEGRATED CIRCUIT FOR CONTROL OF THE TRANSIENT RECOVERY VOLTAGE IN DIRECT AND SYNTHETIC TESTING OF HIGH VOLTAGE CIRCUIT BREAKERS

The present invention concerns a new testing method and a novel integrated testing circuit for determining the breaking capacity of high voltage circuit breakers by applying a transient recovery voltage of a predetermined form to such breakers.

One of the major problems in testing the breaking capacity of high voltage circuit breakers is to determine the transient recovery voltage (TRV) waveform to be applied during testing, which waveform is in accordance with system conditions in general and with specifications in particular.

As a result of wide research on existing power systems, new specifications and standards have been drawn up for the testing of circuit breakers.

However, the specifications and standards of the required TRV have been defined in two different ways. On the one hand, the International Electro-Technical Commission (IEC) defines, in its publication No. 56, TRV by means of four parameters while the American National Standard Institution (ANSI) defines TRV by developing an exponential-cosine curve. This has consequently provided test stations with the complex task of developing a test circuit capable of producing TRV forms in accordance with those standards.

A prime object of the present invention consists in providing a method and a single test circuit able to produce all TRV forms required by the IEC standards and the EXCOS curve of the ANSI standard. The test circuit of the invention is relatively inexpensive and substantially easy to handle.

The IEC specifications refer to two standard TRV waveforms defined by two parameters up to 100 kV or by four or, alternatively, two parameters over 100 kV. On the other hand, the new ANSI standard requires that the TRV envelope be in the form of an EX-COS curve in the case of terminal faults for rated voltages of 120 kV and over and for all rated short-circuit currents.

The main difficulty in testing stations resides in developing a simple circuit to obtain a TRV waveform which, in the actual system, is a superposition of several components, namely a multi-frequency wave. It is particularly difficult to produce the initial shape of the TRV which is, in fact, one of the most important factors in testing circuit breakers.

Above all, great care must be taken to eliminate or reduce the losses of energy that can occur in complex test circuits.

A further object of the invention is to provide a test circuit capable of producing both the low frequency part and the high frequency part of the TRV form in accordance with the above-mentioned standards, and this being achieved by direct testing.

Hitherto, a number of test circuits have been designed to produce a TRV curve as defined by the four parameters of the IEC, such as an artificial line of eight $\pi$ sections in order to obtain a steep initial rate of rise. This type of circuit is indeed expensive to produce and great losses of energy take place. On the other hand, an artificial line in parallel with the circuit breaker under test and including four elements has been proposed so as to meet the ANSI standards. But, all those circuits present positive handling difficulties and, what is more, produce high losses of energy due to the great number of elements composing the circuit.

Another object of the invention is therefore to provide a test circuit which will not only meet all the requirements of the standards but prove far easier to put into practice. The multi-frequency test circuit of the invention is capable of providing a TRV of a predetermined form and generally comprises a first multi-parameter network for producing low frequency components of the TRV form, this network being constituted of a first inductance connected in series between a power source and the circuit breaker undergoing tests, a capacitance-resistance unit connected to the output of the first inductance; and a second multi-parameter network for producing high-frequency components of the TRV, this second network being connected in series with the unit, while both of the latters are connected across the terminals of the circuit breaker. The TRV waveforms produced through the circuit of the invention are in all respect in conformity with the requirements of both standard associations.

The above and other objects and purposes of the present invention will become apparent through the following description of preferred embodiments given with reference to the accompanying drawings, wherein FIG. 1 shows a multi-frequency test circuit in accordance with the present invention;

Figure 1:
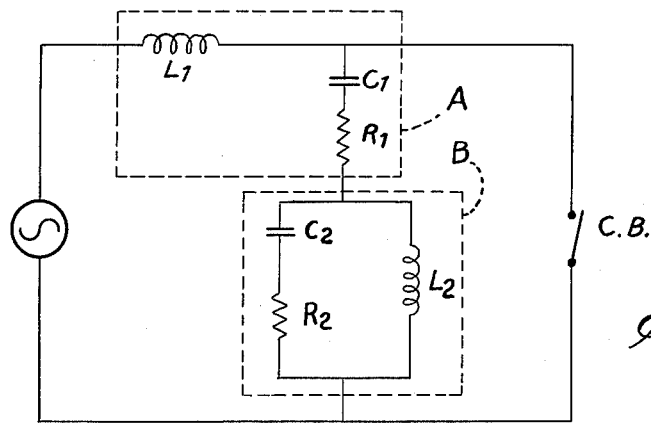

FIG. 1 shows a multi-frequency test circuit able to produce TRV waveforms according to standards. The shown circuit is more generally referred to as a double frequency circuit. It comprises a first multi-parameter network "A" which generates the low-frequency components of the TRV waveform. A multi-parameter network "B" serially connected to the network A supplies the high-frequency components of the TRV form.

Preferably, the network A is constituted of an inductance $L_1$ connected to a capacitance $C_1$ which is serially connected to a resistance $R_1$, while the network B includes an inductance $L_2$ in parallel with a capacitance $C_2$ and a resistance $R_2$ connected in series. A circuit breaker C.B. to be tested is introduced between the input of capacitance $C_1$ and the output of the network B. This circuit breaker is supplied by a high voltage A.C. source S.

The instantaneous recovery voltage produced across the circuit breaker C.B. is given by the following equation:

$$V = E_1 \left[ 1 - e^{-\delta_1 t} \left( \cos \omega_1 t - \frac{\delta_1}{\omega_1} \sin \omega_1 t \right) \right] + E_2 e^{-\delta_2 t} \sin \omega_2 t$$

Where, $V$ = instantaneous recovery voltage across the circuit breaker;
$E_1 = kL_1$ = low frequency recovery voltage;
$E_2 = kL_2$ = high frequency recovery voltage;
$\delta_1 = R_1/2L_1$ = series resistance damping of the first network
$\delta_2 = 1/2R_2C_2$ = parallel resistance damping of the second network As seen from the above equation, the double damping $\delta_1$ and $\delta_2$ gives a great diversity of TRV waveforms so as to meet the requirements stipulated by the standards. The main element of control is the resistor $R_2$ which gives this circuit the capacity of producing, in particular, a large variety of forms for the initial rate of rise.

A capacitance which may be referred to as a fifth parameter may be added across the terminals of the circuit breaker C.B. for controlling the initial part of the waveform.

Figure 2:
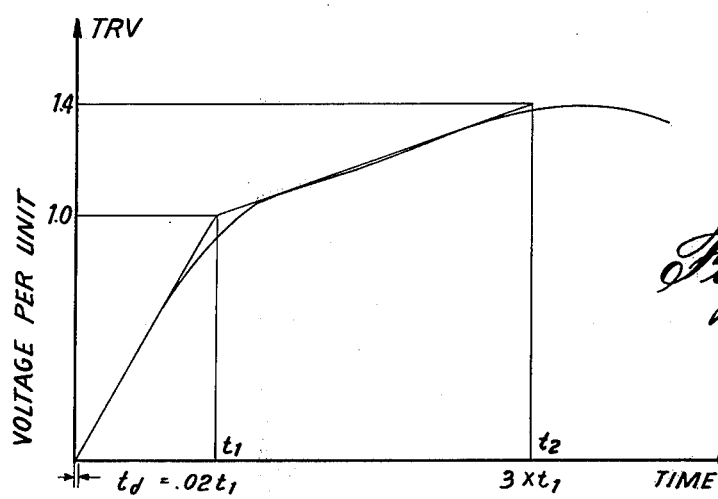
FIG. 2 illustrates a TRV waveform produced by the circuit of figure 1 and meeting the requirements of the IEC with respect to the 100% of rated interrupting capability of a circuit breaker.
Figure 3:
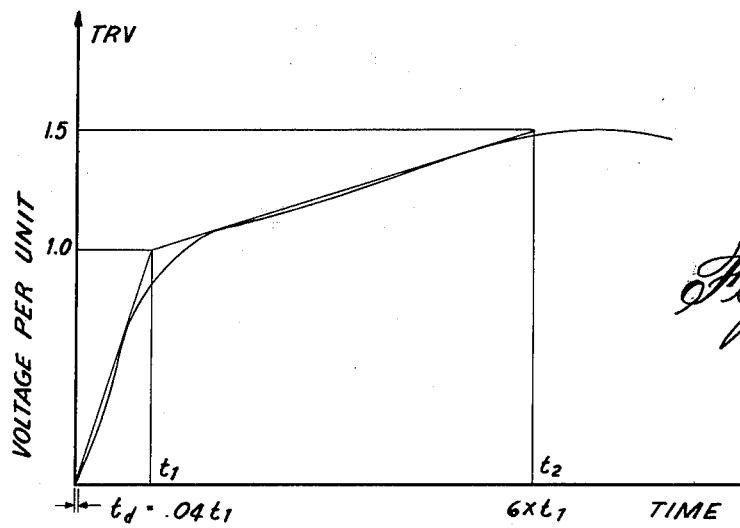
FIG. 3 shows a variant of the curve of FIG. 2, but for a 60% of rated interrupting capability of a circuit breaker.
Figure 4:
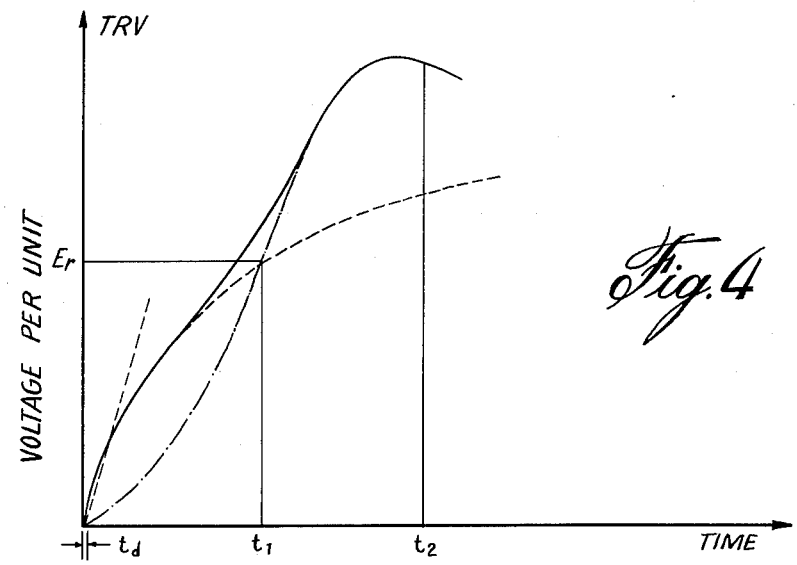
FIG. 4 shows a TRV waveform produced by the circuit of FIG. 1 and meeting the requirements of the ANSI EX-COS envelope, at 100% of rated interrupting capability of a circuit breaker.

By adequately selecting the values of the various components constituting the circuit of FIG. 1, it is possible to reproduce the TRV waveforms illustrated in FIGS. 2 to 4 which are in conformity with the IEC and ANSI requirements.

FIG. 2 relates to an IEC test duty for the testing of a circuit breaker at its 100% of rated interrupting capability. To meet the IEC standard, the following values for $C_1$, $R_1$, $L_2$, $C_2$ and $R_2$ have been selected.

$C_1 = 0.117\ t_2^2/L_1\ \mu F$
$R_1 = 0.75\ \sqrt{L_1/C_1}\ \Omega$
$L_2 = 0.18\ L_1$ mH
$C_2 = 1.1\ C_1\ \mu F$
$R_2 = 0.35\ \sqrt{L_2/C_2}\ \Omega$
$L_1$ and $t_2$ are defined by KA and KV.

An initial time delay $t_d$ of $0.02\ t_1$ is noted upon initiation of the low frequency circuit of FIG. 1.

FIG. 3 shows another TRV waveform corresponding to an IEC test duty of a circuit breaker referring to 60% of its rated interrupting capability. It is to be noted that time $t_2$ is 6 times longer than $t_1$ whereas in FIG. 2 time $t_2$ is only 3 times longer. A time delay at the initial rate of rise of the waveform equal to $0.04\ t_1$ is noted. The values for $C_1$, $R_1$, $L_2$, $C_2$ and $R_2$ have been selected as follows:

$C_1 = 0.1\ t_2^2/L_1\ \mu F$
$R_1 = 0.9\ \sqrt{L_1/C_1}\ \Omega$
$L_2 = 0.87\ L_1$ mH
$C_2 = 0.3\ C_1\ \mu F$
$R_2 = 1.5\ \sqrt{L_2/C_2}\ \Omega$
$L_1$ and $t_2$ are defined by KA and KV.

FIG. 4 shows a TRV waveform obtained through the circuit of FIG. 1 and which fulfills the requirements of the ANSI standard with respect to the EX-COS envelope for the testing of a circuit breaker working at 100% of its rated interrupting capability. The component values therefore selected are the following:

$C_1 = 0.105\ t_2^2/L_1\ \mu F$
$R_1 = 0$
$L_2 = 0.4\ L_1$ mH
$C_2 = 0.75\ C_1\ \mu F$
$R_2 = 1.73\ \sqrt{L_2/C_2}\ \Omega$
$L_1$ and $t_2$ are defined by KA and KV.

As mentioned above, a time delay is present at the initial part of the TRV curve and this is due mainly to the presence in testing stations of a capacitance which is considerably higher than that in the actual system. However, the value of the time delay may be adjusted to meet the new standard requirements. For instance, a parallel capacitance $C_o$ may be added across the circuit breaker terminals to make the initial tangent $du/dt = 0$ in order to simulate the real system conditions. This capacitance $C_o$, adding to the parasite capacitance normally existing in testing stations shall not exceed a certain percentage of the capacitance $C_1$.

It is noted that when testing is performed with very high rated short circuit currents, $L_1$ is normally relatively low while $C_1$ is high. This gives a large value for $C_o$, which is normally larger than the parasite capacitance. On the other hand, when the short circuit currents are low, $C_1$ is also low and the parasite capacitance may exceed the value of $C_o$. In most cases, this can be compensated by increasing the resistance $R_2$ and then by readjusting the other circuit parameters.

Figure 5:
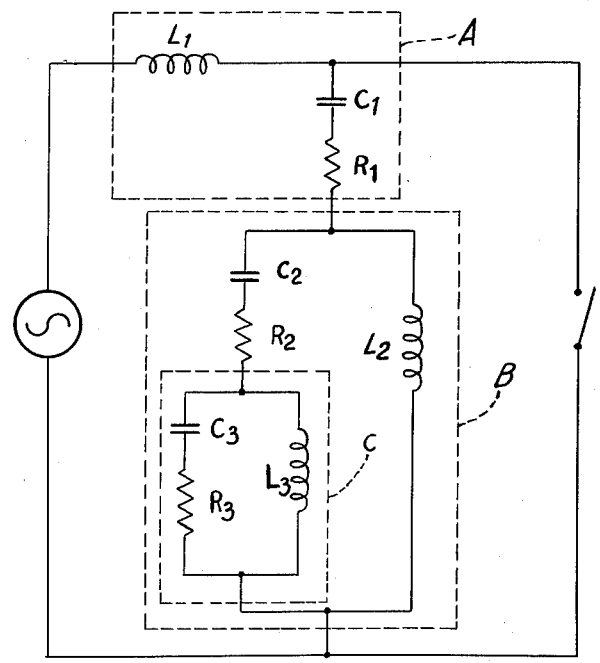
FIG. 5 shows a variation of the testing circuit illustrated in FIG. 1.

FIG. 5 shows a test circuit similar to the multi-frequency test circuit of FIG. 1, wherein a multi-parameter circuit "C" has been inserted in series with the resistance $R_2$ in order to more accurately control the very initial part of the TRV curve.

For instance, the time constant of the circuit C may be made equal to 10μsec and hence allows a substantial reduction in the initial time delay. The circuit C is mainly constituted of a capacitance $C_3$ serially connected to a resistance $R_3$, both in parallel with an inductance $L_3$. It is understood that an even greater reduction in the initial time delay is possible through the addition of circuits similar to circuit C, each being inserted in series with the resistance of the preceding circuit and each having a time constant which is smaller than the one of the preceding circuit.

Therefore, the test circuit of the invention is able to produce a wave shape which is conform with the latest National and International Standards. The circuit is easy to handle and relatively inexpensive to produce since the high frequency circuit is rated for lower voltages and for limited current.

It has been found that the losses of energy are generally caused by the resistance $R_1$ whereas the influence of the auxiliary circuit ($L_2 - C_2 - R_2$) is practically negligible. This means, in the case of an EX-COS curve (FIG. 4), a substantial economy (up to 10%) in the cost of components due to the total absence of the resistance $R_1$.

In the IEC four-parameter curves, the resistance $R_1$ is introduced to compensate for parasite capacitance. When this capacitance is as low as 10 nF the losses are negligible. But when its value reaches 20 nF and more, the losses are about 2–6%.

The circuit of the invention, although primarily designed for direct testing may also be used for synthetic testing and represents a very economic solution as regards capacitor banks. Then, in the case of the EX-COS curve, the parameters do not need changing. As for the IEC curve, the resistance $R_1$ is to be reduced for reasons of economy; this, however, does not hamper the operation of the circuits since a very low parasite capacitance is present on synthetic testing platforms.

To sum up, direct testing of circuit breakers is generally limited by the short circuit power of test stations. In spite of this, direct testing surely remains the most accurate method of testing and will for a long time. Therefore, the multi-frequency test circuit of the invention permits to perform direct testing in a very economical way. This test circuit permits to obtain a great diversity of TRV shapes (particularly as regards their initial part) including those required by the IEC and ANSI standards. Moreover, the circuit of the invention is remarkable by its simplicity which is an important factor for the testing procedures in test statistics.

Furthermore, due to the reduced number of circuit elements used, energy losses are relatively low and depend largely on the parasite capacitance in the test station.

I claim:

1. A multi-frequency test circuit for testing high voltage circuit breakers, said circuit being capable of providing a transient recovery voltage of a predetermined form to test the breaking capacity of circuit breakers, said test circuit comprising a high voltage A.C. source;

a first multi-parameter network for producing low frequency components of said transient recovery voltage, said first network being constituted of a first inductance connected in series between said source and a circuit breaker, a capacitance-resistance unit connected to the output of said first inductance;

a second multi-parameter network for producing high frequency components of said transient recovery voltage, said second network including a second inductance in parallel with a second resistance serially connected to a second capacitance and being connected in series with said first unit, the second network and the unit being connected across the terminals of said circuit breaker, whereby a transient recovery voltage waveform for testing the breaking capacity of the circuit breaker is produced.

2. A test circuit as claimed in claim 1, wherein said unit of said first network includes a first capacitance serially connected to a first resistance.

3. A test circuit as claimed in claim 1, wherein a third capacitance is connected in parallel with the circuit breaker undergoing test for controlling the initial part of the transient recovery voltage waveform.

4. A test circuit as claimed in claim 2, wherein the value of the first resistance varies from 0 to 0.75 times the square root of the ratio of the first inductance and the first capacitance.

5. A test circuit as claimed in claim 2, wherein the value of the second inductance varies from 0.18 to 0.87 times the value of the first inductance.

6. A test circuit as claimed in claim 2, wherein the value of the second capacitance varies from 0.3 to 1.1 times the value of the first capacitance.

7. A test circuit as claimed in claim 1, wherein the second resistance has a value varying from 0.35 to 1.73 times the value of the square root of the ratio of the second inductance and the second capacitance.

8. A test circuit as claimed in claim 1, wherein a third multi-parameter network constituted of a serially connected capacitance and resistance being in parallel with an inductance is inserted in series with the second resistance.

* * * * *